United States Patent
Sekiya (10) Patent No.: US 10,826,456 B2
(45) Date of Patent: Nov. 3, 2020

(54) METHOD OF MANUFACTURING SURFACE ACOUSTIC WAVE DEVICE CHIPS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 158 days.

(21) Appl. No.: 15/689,889

(22) Filed: Aug. 29, 2017

(65) Prior Publication Data

US 2018/0076784 A1 Mar. 15, 2018

(30) Foreign Application Priority Data

Sep. 9, 2016 (JP) .................................. 2016-176880

(51) Int. Cl.
| | | |
|---|---|---|
| H03H 3/02 | (2006.01) | |
| H01L 41/338 | (2013.01) | |
| H03H 9/02 | (2006.01) | |
| H01L 41/22 | (2013.01) | |
| H03H 3/08 | (2006.01) | |
| H01L 41/337 | (2013.01) | |

(52) U.S. Cl.
CPC ............. H03H 3/02 (2013.01); H01L 41/22 (2013.01); H01L 41/337 (2013.01); H01L 41/338 (2013.01); H03H 3/08 (2013.01); H03H 9/02551 (2013.01); H03H 9/02559 (2013.01); H03H 9/02622 (2013.01); H03H 9/02842 (2013.01)

(58) Field of Classification Search
CPC . H03H 3/02; H03H 3/08; H01L 41/22; H01L 41/337; H01L 41/338; H01L 21/78; H01L 21/6836
See application file for complete search history.

(56) References Cited

U.S. PATENT DOCUMENTS

| | | | | |
|---|---|---|---|---|
| 4,325,182 A | * | 4/1982 | Tefft .................... | H01L 21/3065 148/DIG. 84 |
| 6,998,571 B2 | * | 2/2006 | Sekiya ............... | B23K 26/0853 219/121.67 |
| 7,838,331 B2 | * | 11/2010 | Komura ............... | B23K 26/009 438/106 |
| 10,483,941 B2 | * | 11/2019 | Shimizu ............. | H03H 9/02614 |

(Continued)

FOREIGN PATENT DOCUMENTS

JP 2010-056833 3/2010

*Primary Examiner* — Peter Dungba Vo
*Assistant Examiner* — Jeffrey T Carley
(74) *Attorney, Agent, or Firm* — Greer Burns & Crain Ltd.

(57) ABSTRACT

A method of manufacturing surface acoustic wave device chips includes grinding a reverse side of a wafer with a surface acoustic wave device formed in each area demarcated by a plurality of crossing projected dicing lines on a face side of the wafer; before or after grinding, applying a laser beam to the reverse side of the wafer such that the laser beam is focused at a position within the wafer, the position being closer to the face side of the wafer than a position corresponding to a reverse side of each of the surface acoustic wave device chips to be produced from the wafer, thereby forming a modified layer for diffusing an acoustic wave; and after grinding and applying the laser beam, dividing the wafer along the projected dicing lines into a plurality of the surface acoustic wave device chips.

7 Claims, 4 Drawing Sheets

(56) References Cited

U.S. PATENT DOCUMENTS

| | | | | |
|---|---|---|---|---|
| 2001/0035401 A1* | 11/2001 | Manor | ............... | B23K 26/0604 |
| | | | | 219/121.72 |
| 2002/0115235 A1* | 8/2002 | Sawada | .............. | B23K 26/0853 |
| | | | | 438/113 |
| 2004/0065647 A1* | 4/2004 | Kubo | ................ | H01L 21/67092 |
| | | | | 219/121.61 |
| 2004/0222717 A1* | 11/2004 | Matsuda | .................. | H03H 3/08 |
| | | | | 310/313 R |
| 2004/0224483 A1* | 11/2004 | Takyu | ..................... | H01L 21/78 |
| | | | | 438/462 |
| 2005/0003633 A1* | 1/2005 | Mahle | ............... | H01L 21/02016 |
| | | | | 438/463 |
| 2005/0202651 A1* | 9/2005 | Akram | ................... | B28D 1/221 |
| | | | | 438/463 |
| 2005/0227455 A1* | 10/2005 | Park | ................... | B23K 26/0732 |
| | | | | 438/458 |
| 2006/0148212 A1* | 7/2006 | Fukuyo | .............. | B23K 26/0853 |
| | | | | 438/463 |
| 2008/0233712 A1* | 9/2008 | Sekiya | ................ | H01L 21/6835 |
| | | | | 438/462 |
| 2013/0237055 A1* | 9/2013 | Funaya | ................ | H01L 23/522 |
| | | | | 438/672 |
| 2014/0020822 A1* | 1/2014 | Shimizu | ................ | H01L 41/313 |
| | | | | 156/250 |
| 2014/0111062 A1* | 4/2014 | Bauer | ................. | B81C 1/00301 |
| | | | | 310/313 R |
| 2015/0159821 A1* | 6/2015 | Arakawa | .............. | B23K 26/402 |
| | | | | 216/24 |
| 2016/0043008 A1* | 2/2016 | Murray | .............. | G01N 29/2418 |
| | | | | 438/5 |
| 2016/0112029 A1* | 4/2016 | Tai | ..................... | H03H 9/02669 |
| | | | | 310/313 B |

* cited by examiner

METHOD OF MANUFACTURING SURFACE ACOUSTIC WAVE DEVICE CHIPS

BACKGROUND OF THE INVENTION

Field of the Invention

The present invention relates to a method of manufacturing surface acoustic wave device chips.

Description of the Related Art

Bandpass filters for passing only electric signals in a desired frequency band play an important role in wireless communication apparatus such as mobile phones. There has been known a surface acoustic wave (SAW) device (surface acoustic wave filter) that makes use of a surface acoustic wave which propagates along the surface of a material, as such a bandpass filter (see, for example, Japanese Patent Laid-Open No. 2010-56833). The surface acoustic wave device includes a crystalline wafer made of a piezoelectric material such as quartz crystal ($SiO_2$), lithium niobate ($LiNbO_3$), lithium tantalate ($LiTaO_3$), or the like, and a pair of comb-shaped arrays of electrodes (IDTs: interdigital transducers) formed on the surface of the wafer. The surface acoustic wave device passes only an electric signal in a frequency band depending on the kind of the piezoelectric material and the intervals of the electrodes of the IDTs.

SUMMARY OF THE INVENTION

When the surface acoustic wave device is in operation, part of an acoustic wave produced in the vicinity of the input side interdigital transducer may be propagated through the wafer and be reflected by the reverse side of the wafer. If the reflected acoustic wave reaches the output side interdigital transducer, then the surface acoustic wave device has its frequency characteristics degraded.

It is therefore an object of the present invention to provide a method of manufacturing surface acoustic wave device chips having good frequency characteristics.

In accordance with an aspect of the present invention, there is provided a method of manufacturing surface acoustic wave device chips, including: a grinding step of grinding a reverse side of a wafer with a surface acoustic wave device formed in each area demarcated by a plurality of crossing projected dicing lines on a face side of the wafer; before or after the grinding step, a laser beam applying step of applying a laser beam having a wavelength with which the wafer is transmittable to the reverse side of the wafer such that the laser beam is focused at a position within the wafer, the position being closer to the face side of the wafer than a position corresponding to a reverse side of each of the surface acoustic wave device chips to be produced from the wafer, to modify an inside of the wafer at the area in which the surface acoustic wave device is formed, thereby forming a modified layer for diffusing an acoustic wave; and after the grinding step and the laser beam applying step, a dividing step of dividing the wafer along the projected dicing lines into a plurality of the surface acoustic wave device chips.

According to another aspect of the present invention, the method should preferably further include, after the grinding step and before the dividing step, a polishing step of polishing the reverse side of the wafer.

Since the modified layer for diffusing an acoustic wave is formed in the wafer by the method of manufacturing surface acoustic wave device chips according to the present invention, an acoustic wave is prevented from being reflected by the reverse sides of the surface acoustic wave device chips. Therefore, the surface acoustic wave device chips that are manufactured by the method according to the present invention have good frequency characteristics.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of manufacturing surface acoustic wave device chips according to a preferred embodiment of the present invention will be described below with reference to the accompanying drawings. The method of manufacturing surface acoustic wave device chips according to the preferred embodiment includes a grinding step (see FIG. 2A), a polishing step (see FIG. 2B), a laser beam applying step (see FIG. 3A), and a dividing step (see FIG. 3B). In the grinding step, the reverse side of a wafer with surface acoustic wave devices formed on the face side thereof is ground. In the polishing step, the reverse side of the wafer which has been ground is polished. In the laser beam applying step, a laser beam having a wavelength with which the wafer is transmittable is focused to modify the inside of the wafer, forming a modified layer for diffusing an acoustic wave in the wafer. In the dividing step, the wafer is divided into a plurality of surface acoustic wave device chips along projected dicing lines on the wafer. Since the modified layer for diffusing an acoustic wave is formed within the wafer, the surface acoustic wave device chips thus fabricated from the wafer prevent the acoustic wave from being reflected from the reverse sides thereof. The method of manufacturing surface acoustic wave device chips according to the present embodiment will be described in detail below.

Figure 1A:
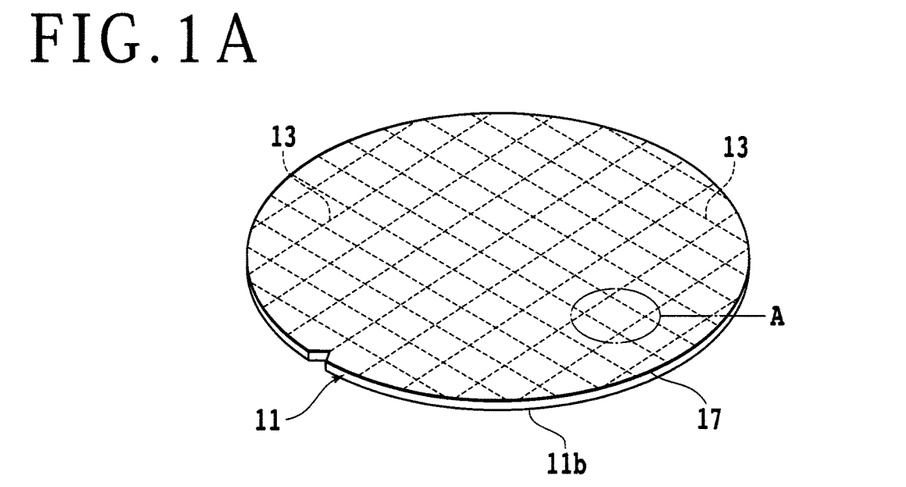
FIG. 1A is a perspective view schematically showing a wafer.
Figure 1B:
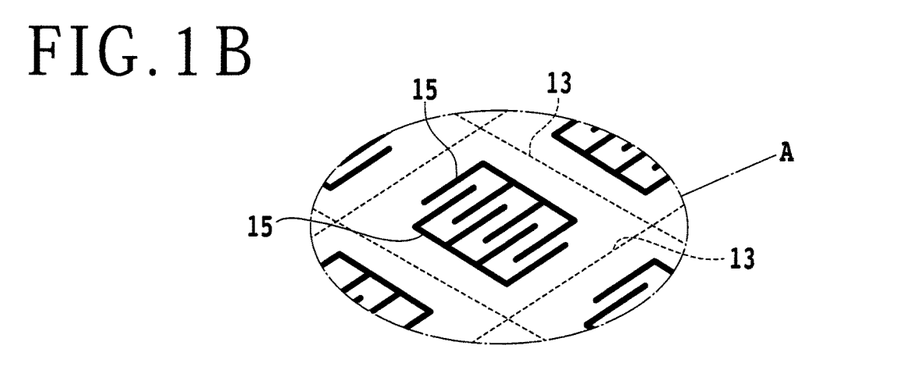
FIG. 1B is an enlarged fragmentary perspective view showing a region A of a face side of the wafer.
Figure 1C:
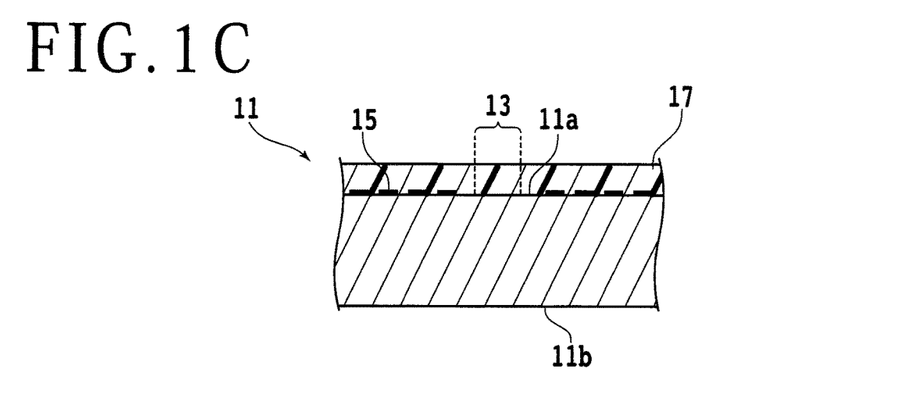
FIG. 1C is an enlarged fragmentary cross-sectional view of the wafer.

FIG. 1A is a perspective view schematically showing a wafer used in the present embodiment, FIG. 1B is an enlarged fragmentary perspective view showing a region A of the face side of the wafer, and FIG. 1C is an enlarged fragmentary cross-sectional view of the wafer. A wafer 11 according to the present embodiment is disk-shaped and made of a piezoelectric material such as quartz crystal (SiO₂), lithium niobate (LiNbO₃), lithium tantalate (LiTaO₃), or the like. The wafer 11 has a face side 11a demarcated into a plurality of areas by a plurality of projected dicing lines (streets) 13 arranged in a grid-like pattern. Each of the areas has a surface acoustic wave device formed therein which has a pair of interlocking comb-shaped arrays of electrodes (IDTs: interdigital transducers) 15. A covering layer 17 is provided on the face side 11a of the wafer 11. The covering layer 17 is formed of a resin such as epoxy resin, polyimide resin, phenolic resin, or the like, in a manner to cover the face side 11a in its entirety. Electrode pads, not shown, connected to the electrodes 15, for example, are disposed on the face side (upper surface) of the covering layer 17. Other structures and spaces (gaps) may be formed on and in the covering layer 17. The wafer 11 thus constructed is divided into a plurality of surface acoustic wave device chips 41 (see FIGS. 4A and 4B) along the projected dicing lines 13.

Figure 2A:
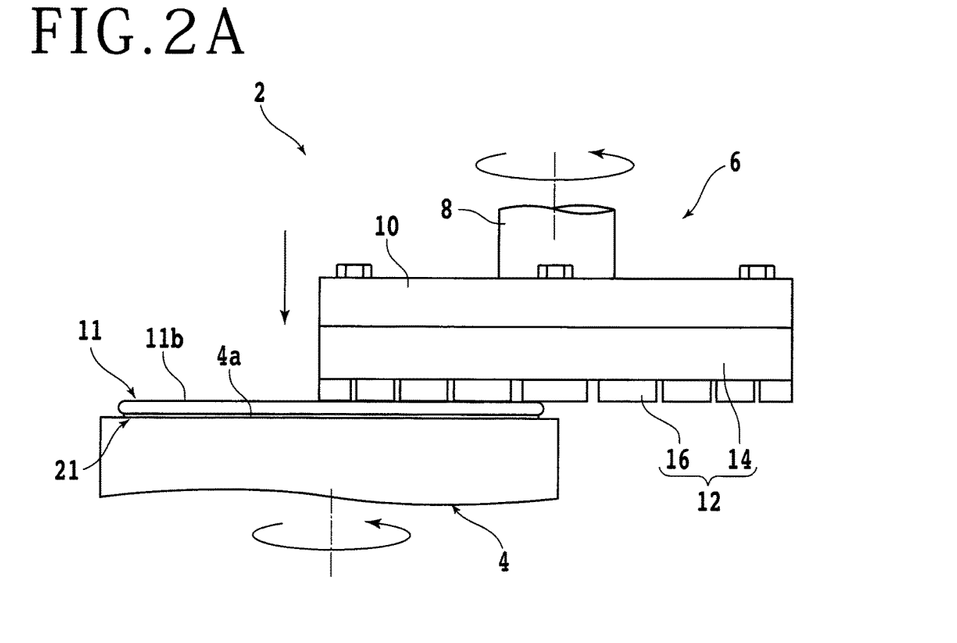
FIG. 2A is a side elevational view illustrating a grinding step.

In the method of manufacturing surface acoustic wave device chips according to the present embodiment, the grinding step is initially carried out to grind the reverse side 11b of the wafer 11. FIG. 2A is a side elevational view illustrating the grinding step. The grinding step is performed using a grinding apparatus 2 shown in FIG. 2A, for example. The grinding apparatus 2 includes a chuck table 4 for holding the wafer 11 under suction thereon. The chuck table 4 is coupled to a rotary drive source, not shown, such as a motor or the like and is rotatable about a rotational axis extending substantially parallel to vertical directions by rotational power generated by the rotary drive source. A moving mechanism, not shown, is provided beneath the chuck table 4. The chuck table 4 is movable in horizontal directions by the moving mechanism. The chuck table 4 has an upper surface, part of which serves as a holding surface 4a for holding under suction the face side 11a, on which the covering layer 17 is provided, of the wafer 11. The holding surface 4a is connected to a suction source, not shown, through a suction channel, not shown, that is defined in the chuck table 4. The suction source applies a negative pressure to the holding surface 4a through the suction channel, thereby holding the wafer 11 under suction on the chuck table 4.

The grinding apparatus 2 also includes a grinding unit 6 disposed above the chuck table 4. The grinding unit 6 has a spindle housing, not shown, supported on a vertically moving mechanism, not shown. The spindle housing houses a spindle 8 therein, and a disk-shaped mount 10 is fixed to the lower end of the spindle 8 that projects from the spindle housing. A grinding wheel 12 which is essentially of the same diameter as the mount 10 is mounted on the lower surface of the mount 10. The grinding wheel 12 includes a wheel base 14 made of a metal material such as stainless steel, aluminum, or the like, and a plurality of grinding stones 16 arranged in an annular pattern on the lower surface of the wheel base 14. The spindle 8 has an upper proximal end coupled to a rotary drive source, not shown, such as a motor or the like. The grinding wheel 12 is rotatable about a rotational axis extending substantially parallel to vertical directions by rotational power generated by the rotary drive source. A nozzle, not shown, for supplying a grinding liquid such as pure water or the like to the wafer 11 is provided in or near the grinding unit 6.

In the grinding step, the wafer 11 is first held under suction on the chuck table 4. According to the present embodiment, a protective member 21 made of a resin or the like is applied to the face side 11a of the wafer 11. The protective member 21 is effective to protect the wafer 11 from shocks or the like applied during the grinding step. For holding the wafer 11 under suction on the chuck table 4, the protective member 21 applied to the wafer 11 is brought into contact with the holding surface 4a of the chuck table 4, and then the suction source exerts a negative pressure on the holding surface 4a. The wafer 11 is now held under suction on the chuck table 4, with the reverse side 11b being exposed upwardly. Then, the chuck table 4 is moved to a position beneath the grinding unit 6. As shown in FIG. 2A, the chuck table 4 and the grinding wheel 12 are rotated about their axes, and while the grinding liquid is being supplied to the reverse side 11b of the wafer 11, the spindle housing and hence the spindle 8 and the grinding wheel 12 are lowered. The rate of descent of the spindle housing, i.e., the distance that the spindle housing is lowered, is adjusted such that the lower surfaces of the grinding stones 16 are pressed against the reverse side 11b of the wafer 11. The reverse side 11b is thus ground to reduce the thickness of the wafer 11. When the wafer 11 is thinned to a predetermined thickness (finished thickness), the grinding step is finished.

According to the present embodiment, the single grinding unit 6, i.e., the single set of grinding stones 16, is used to grind the reverse side 11b of the wafer 11. However, two or more grinding units, i.e., two or more sets of grinding stones, may be used to grind a wafer. For example, a set of grinding stones of abrasive grains having large diameters may be used to effect rough grinding of the wafer, and another set of grinding stones of abrasive grains having small diameters may be used to effect finished grinding of the wafer, so that the reverse side 11b of the wafer 11 can be made more planar without greatly increasing the period of time required to grind the wafer.

Figure 2B:
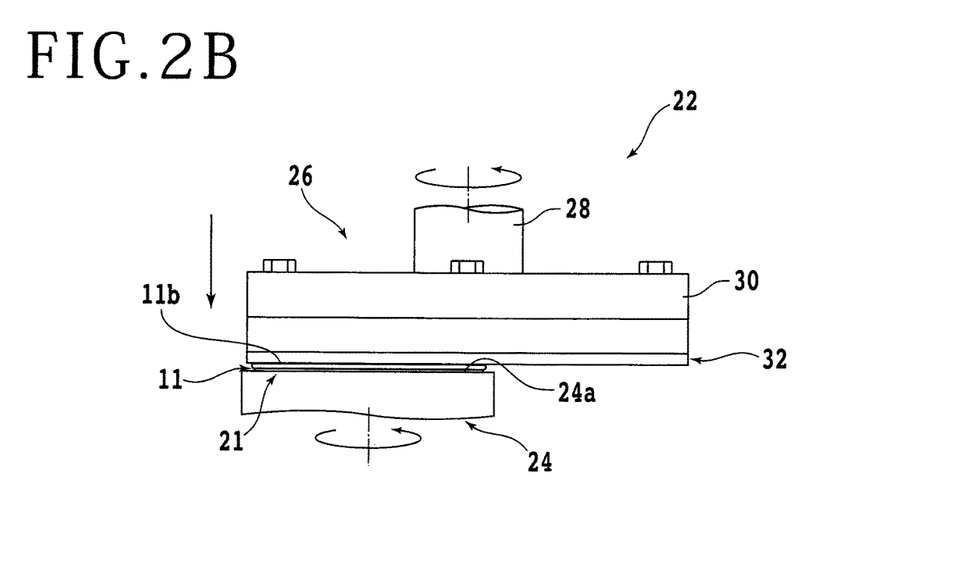
FIG. 2B is a side elevational view illustrating a polishing step.

The grinding step is followed by the polishing step in which the reverse side 11b of the wafer 11 is polished. FIG. 2B is a side elevational view illustrating the polishing step. The polishing step is performed using a polishing apparatus 22 shown in FIG. 2B, for example. The polishing apparatus 22 includes a chuck table 24 for holding the wafer 11 under suction thereon. The chuck table 24 is coupled to a rotary drive source, not shown, such as a motor or the like and is rotatable about a rotational axis extending substantially parallel to vertical directions by rotational power generated by the rotary drive source. A moving mechanism, not shown, is provided beneath the chuck table 24. The chuck table 24 is movable in horizontal directions by the moving mechanism. The chuck table 24 has an upper surface, part of which serves as a holding surface 24a for holding under suction the face side 11a, on which the covering layer 17 is provided, of the wafer 11. The holding surface 24a is connected to a suction source, not shown, through a suction channel, not shown, that is defined in the chuck table 24. The suction source applies a negative pressure to the holding surface 24a through the suction channel, thereby holding the wafer 11 under suction on the chuck table 24.

The polishing apparatus 22 also includes a polishing unit 26 disposed above the chuck table 24. The polishing unit 26 has a spindle housing, not shown, supported on a vertically moving mechanism, not shown. The spindle housing houses a spindle 28 therein, and a disk-shaped mount 30 is fixed to the lower end of the spindle 28 that projects from the spindle housing. A polishing pad 32 which is essentially of the same diameter as the mount 30 is mounted on the lower surface of the mount 30. The polishing pad 32 includes a polishing cloth made of nonwoven fabric, foamed urethane, or the like, for example. The spindle 28 has an upper proximal end coupled to a rotary drive source, not shown, such as a motor or the like. The polishing pad 32 is rotatable about a rotational axis extending substantially parallel to vertical directions by rotational power generated by the rotary drive source. A nozzle, not shown, for supplying a polishing liquid or slurry with abrasive grains dispersed therein to the wafer 11 is provided in or near the polishing unit 26.

In the polishing step, the protective member 21 applied to the wafer 11 is brought into contact with the holding surface 24a of the chuck table 24, and then the suction source exerts a negative pressure on the holding surface 24a. The wafer 11 is now held under suction on the chuck table 24, with the reverse side 11b being exposed upwardly. Then, the chuck table 24 is moved to a position beneath the polishing unit 26. As shown in FIG. 2B, the chuck table 24 and the polishing pad 32 are rotated about their axes, and while the polishing liquid is being supplied to the reverse side 11b of the wafer 11, the spindle housing and hence the spindle 28 and the polishing pad 32 are lowered. The rate of descent of the spindle housing, i.e., the distance that the spindle housing is lowered, is adjusted such that the lower surface of the polishing pad 32 is held against the reverse side 11b of the wafer 11. The reverse side 11b of the wafer 11 is thus further planarized to increase the transverse intensity of surface acoustic wave device chips. The polishing step may employ a dry-type polishing process that uses no polishing liquid. The polishing step may be dispensed with if the grinding step is able to achieve a necessary level of transverse intensity, i.e., planarity of the reverse side 11b.

Figure 3A:
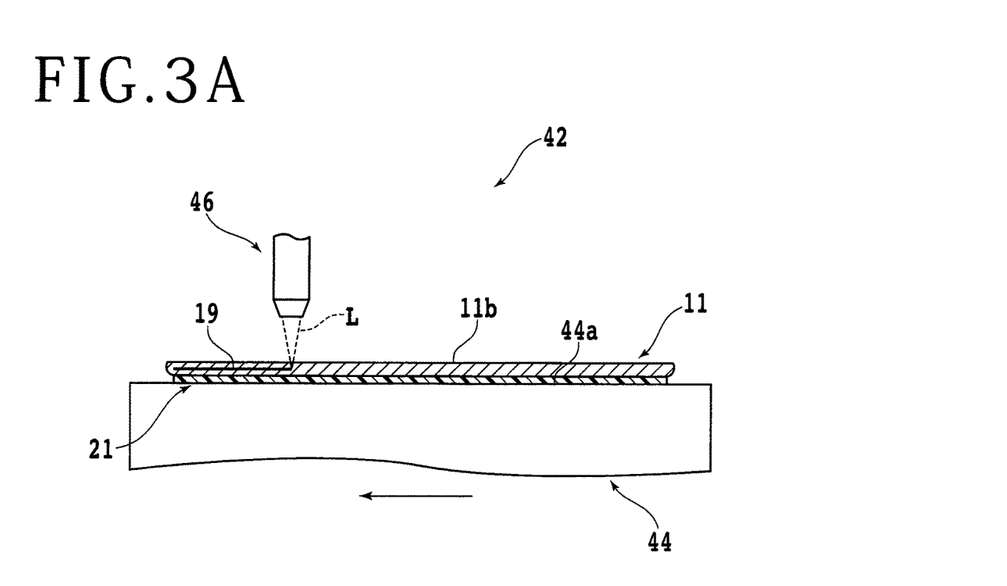
FIG. 3A is a side elevational view, partly in cross section, illustrating a laser beam applying step.

The polishing step is followed by the laser beam applying step in which a laser beam is applied to a wafer to modify the inside of the wafer, forming a modified layer for diffusing an acoustic wave in the wafer. FIG. 3A is a side elevational view, partly in cross section, illustrating the laser beam applying step. The laser beam applying step is performed using a laser processing apparatus 42 shown in FIG. 3A. The laser processing apparatus 42 includes a chuck table 44 for holding the wafer 11 under suction thereon. The chuck table 44 is coupled to a rotary drive source, not shown, such as a motor or the like and is rotatable about a rotational axis extending substantially parallel to vertical directions by rotational power generated by the rotary drive source. A moving mechanism, not shown, is provided beneath the chuck table 44. The chuck table 44 is movable in horizontal directions by the moving mechanism. The chuck table 44 has an upper surface, part of which serves as a holding surface 44a for holding under suction the face side 11a, on which the covering layer 17 is provided, of the wafer 11. The holding surface 44a is connected to a suction source, not shown, through a suction channel, not shown, that is defined in the chuck table 44. The suction source applies a negative pressure to the holding surface 44a through the suction channel, thereby holding the wafer 11 under suction on the chuck table 44. The laser processing apparatus 42 also includes a laser beam applying unit 46 disposed above the chuck table 44. The laser beam applying unit 46 applies a laser beam L pulse-oscillated by a laser oscillator, not shown, so that the laser beam L is focused at a given position. The laser oscillator is arranged to pulse-oscillate a laser beam L having a wavelength with which the wafer 11 is transmittable, i.e., a wavelength which is hardly absorbed by the wafer 11.

In the laser beam applying step, the protective member 21 applied to the wafer 11 is brought into contact with the holding surface 44a of the chuck table 44, and then the suction source exerts a negative pressure on the holding surface 44a. The wafer 11 is now held under suction on the chuck table 44, with the reverse side 11b being exposed upwardly. Then, the chuck table 44 is moved and rotated to align the laser beam applying unit 46 with a position where a modified layer starts to be formed in the wafer 11. Then, as shown in FIG. 3A, the laser beam applying unit 46 applies a laser beam L having a wavelength with which the wafer 11 is transmittable, i.e., a wavelength which is hardly absorbed by the wafer 11, to the reverse side 11b of the wafer 11, while at the same time the chuck table 44 is moved in a horizontal direction. At this time, the laser beam L is focused at a position within the wafer 11 that is closer to the face side 11a of the wafer 11 than the position corresponding to the reverse sides of surface acoustic wave device chips to be produced from the wafer 11. Since the laser beam L whose wavelength is hardly absorbed by the wafer 11 is focused within the wafer 11, it modifies the inside of the wafer 11 to form a modified layer 19 for diffusing an acoustic wave in the wafer 11.

The modified layer 19 formed in the wafer 11 is not limited to any specific configurations. The modified layer 19 may be of a continuous, integral form or of a discontinuous, discrete form. If the modified layer 19 is of a discontinuous, discrete form, then the separate units of the modified layer 19 are not limited to any pitches or sizes, but may have a size (width or diameter) in the range of 5 to 10 μm and be formed at a pitch in the range of 5 to 20 μm, for example. It is not necessary to form the modified layer 19 in the excess areas of the wafer 11 which will not be used to form surface acoustic wave device chips. In other words, the modified layer 19 may be formed in the areas of the wafer 11 which are demarcated by the projected dicing lines 13 and where the surface acoustic wave devices including the electrodes 15 are formed, and may not be formed in end portions of the wafer 11.

Conditions for forming a modified layer 19 in a wafer 11 made of lithium tantalate, for example, are set as follows:
Wavelength: 532 nm ($YVO_4$ pulsed laser)
Repetitive frequency: 50 kHz
Output power: 0.1 to 2 W When the modified layer 19 is formed in the areas of the wafer 11 which will be used to form surface acoustic wave device chips under the above conditions, the laser beam applying step is finished. There are no limitations on conditions under which to apply the laser beam L. The conditions under which to apply the laser beam L can be set and changed as desired depending on the size and pitch of the modified layer 19.

Figure 3B:
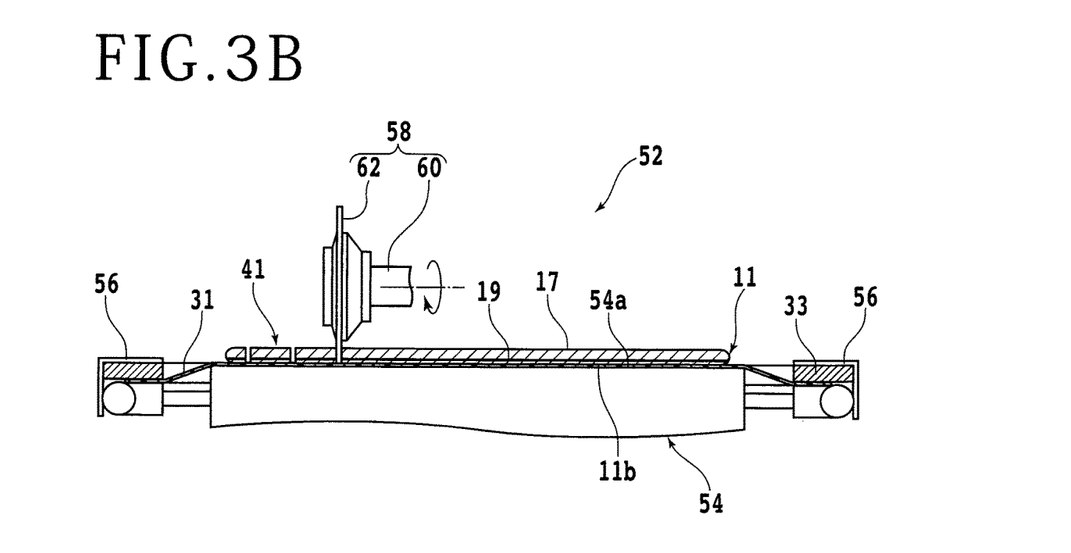
FIG. 3B is a side elevational view, partly in cross section, illustrating a dividing step.

The laser beam applying step is followed by the dividing step in which the wafer 11 is divided into a plurality of surface acoustic wave device chips along the projected dicing lines 13. FIG. 3B is a side elevational view, partly in cross section, illustrating the dividing step. The dividing step is performed using a cutting apparatus 52 shown in FIG. 3B, for example. After the laser beam applying step, as shown in FIG. 3B, a dicing tape 31 that is larger in diameter than the wafer 11 is applied to the reverse side 11b of the wafer 11. An annular frame 33 is fixed to an outer circumferential portion of the dicing tape 31, so that the wafer 11 is supported on the annular frame 33 by the dicing tape 31. At this stage, the protective member 21 applied to the face side 11a of the wafer 11 is peeled off.

The cutting apparatus 52 includes a chuck table 54 for holding the wafer 11 under suction thereon. The chuck table 54 is coupled to a rotary drive source, not shown, such as a motor or the like and is rotatable about a rotational axis extending substantially parallel to vertical directions by rotational power generated by the rotary drive source. A processing-feed mechanism, not shown, is provided beneath the chuck table 54. The chuck table 54 is movable in horizontal processing-feed directions by the processing-feed mechanism. The chuck table 54 has an upper surface, part of which serves as a holding surface 54a for holding under suction the reverse side 11b of the wafer 11. The holding surface 54a is connected to a suction source, not shown, through a suction channel, not shown, that is defined in the chuck table 54. The suction source applies a negative pressure to the holding surface 54a through the suction channel, thereby holding the wafer 11 under suction on the chuck table 54. A plurality of clamps 56 for fixing the annular frame 33 in place are provided around the chuck table 54.

A cutting unit 58 for cutting the wafer 11 is disposed above the chuck table 54. The cutting unit 58 includes a spindle 60 serving as a rotational shaft lying substantially parallel to horizontal directions. The spindle 60 has an end on which an annular cutting blade 62 is mounted. A rotary drive source, not shown, such as a motor or the like is coupled to the other end of the spindle 60. The cutting blade 62 mounted on the spindle 60 is rotatable about its own axis by rotational power generated by the rotary drive source. The cutting unit 58 is supported on a vertically moving mechanism, not shown, which is supported on an indexing-feed mechanism, not shown. Therefore, the cutting unit 58 is movable vertically by the vertically moving mechanism and is also movable in indexing-feed directions perpendicular to the processing-feed directions by the indexing-feed mechanism.

In the dividing step, the dicing tape 31 applied to the wafer 11 is brought into contact with the holding surface 54a of the chuck table 54, and then the suction source exerts a negative pressure on the holding surface 54a. The annular frame 33 is fixed in position by the clamps 56. The wafer 11 is now held under suction on the chuck table 54, with the reverse side 11b being exposed upwardly. Then, the chuck table 54 is turned about its own axis to make any desired one of the projected dicing lines 13 parallel to the processing-feed directions. The chuck table 54 and the cutting unit 58 are moved relatively to each other to align the cutting blade 62 with an extension of the arbitrary projected dicing line 13 that has been made parallel to the processing-feed directions. Thereafter, the lower end of the cutting blade 62 which is being rotated is lowered to a position lower than the reverse side 11b of the wafer 11, and the chuck table 54 is moved in a processing-feed direction. The cutting blade 62 is now caused to incise the wafer 11, fully cutting the wafer 11 along the projected dicing line 13 aligned therewith. The above operations are repeated to cut the wafer 11 along all the projected dicing lines 13, dividing the wafer 11 into a plurality of surface acoustic wave device chips 41. The dividing step is now finished.

Figure 4A:
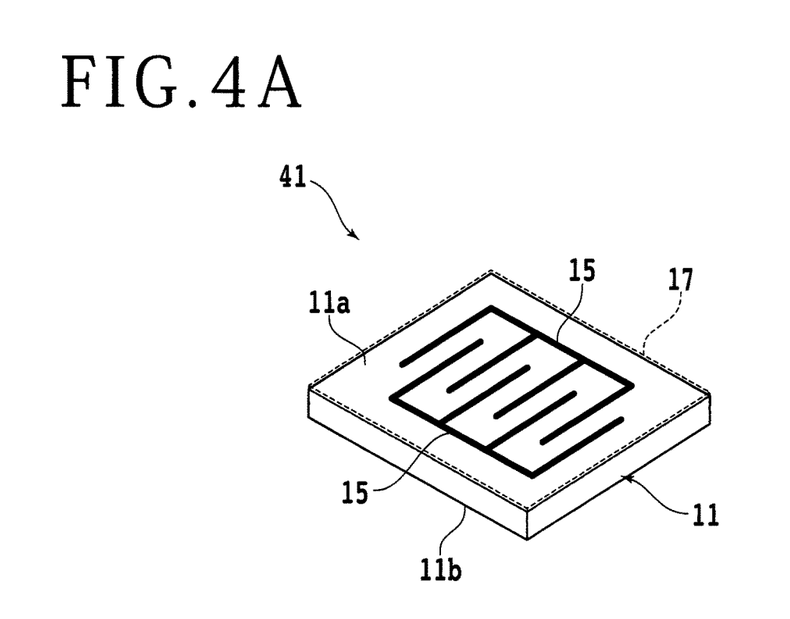
FIG. 4A is a perspective view schematically showing the face side of a surface acoustic wave device chip.
Figure 4B:
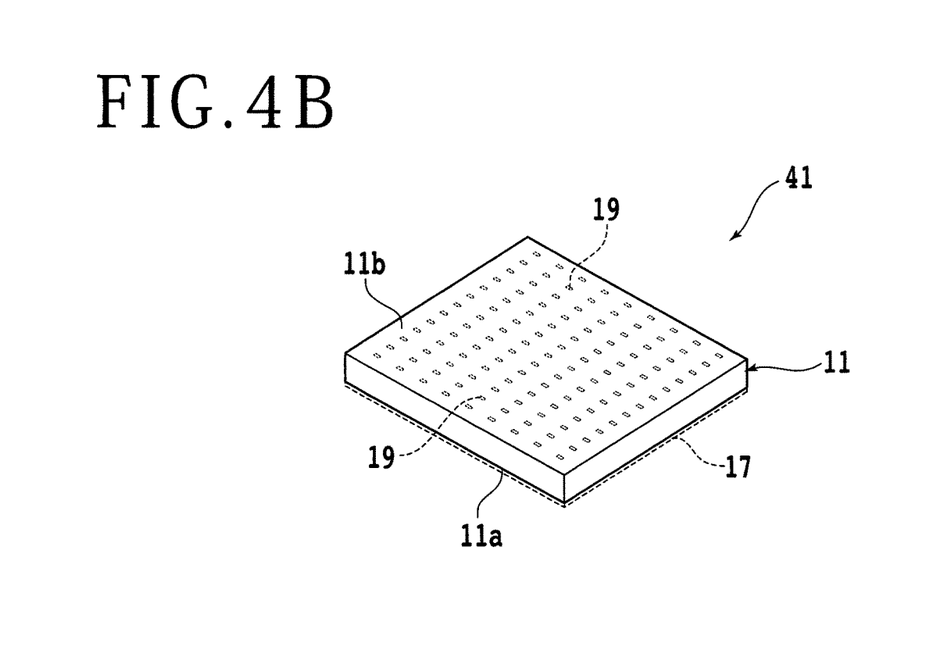
FIG. 4B is a perspective view schematically showing a reverse side of the surface acoustic wave device chip.

FIG. 4A is a perspective view schematically showing the face side of a surface acoustic wave device chip 41, and FIG. 4B is a perspective view schematically showing the reverse side of the surface acoustic wave device chip 41. As shown in FIGS. 4A and 4B, the surface acoustic wave device chip 41 (wafer 11) manufactured by the method according to the present embodiment has the modified layer 19 formed therein for changing the propagation characteristics of an acoustic wave. The acoustic wave that propagates through the surface acoustic wave device chip 41 (wafer 11) is diffused or dispersed by the modified layer 19, and is hardly reflected by the reverse side of the surface acoustic wave device chip 41, i.e., the reverse side 11b of the wafer 11. Consequently, as no unwanted reflected acoustic wave tends to fall on the electrodes 15, the surface acoustic wave device chip 41 is prevented from having its frequency characteristics degraded. The modified layer 19 diffuses not only an acoustic wave that is produced on the face side of the surface acoustic wave device chip 41 and propagates therethrough, but also acoustic waves that are produced by other factors. Consequently, the surface acoustic wave device chip 41 manufactured by the method according to the present embodiment has more excellent frequency characteristics than the conventional surface acoustic wave device chips.

As described above, since the modified layer 19 for diffusing an acoustic wave is formed in the wafer 11 by the method of manufacturing surface acoustic wave device chips according to the present embodiment, the acoustic wave is prevented from being reflected by the reverse side of the surface acoustic wave device chip 41. Therefore, the surface acoustic wave device chip 41 that is thus manufactured has good frequency characteristics.

The present invention is not limited to the above embodiment, but many changes and modifications may be made therein. For example, in the dividing step according to the illustrated embodiment, the wafer 11 is divided by the cutting blade 62 into a plurality of surface acoustic wave device chips 41. However, the wafer 11 may be divided by a laser beam into a plurality of surface acoustic wave device chips 41.

In the illustrated embodiment, the laser beam applying step is carried out after the grinding step and the polishing step. However, the grinding step and the polishing step may be carried out after the laser beam applying step. According to such a modification, the laser beam L is focused at a position within the wafer 11 that is closer to the face side 11a of the wafer 11 than the reverse side 11b thereof, i.e., at a position closer to the face side of a surface acoustic wave device chip than the position corresponding to the reverse side thereof, after the grinding step and the polishing step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing surface acoustic wave device chips, comprising:
   a demarcating step of demarcating a plurality of areas on a wafer by a plurality of crossing projected dicing lines on a face side of the wafer, wherein each of the plurality of areas includes a surface acoustic wave device each having an outer edge and a plurality of electrodes spaced from said outer edge;
   a grinding step of grinding a reverse side of the wafer;
   a laser beam applying step, performed before or after the grinding step, of applying a laser beam, which has a wavelength with which the wafer is transmittable, to the reverse side of the wafer such that the laser beam is focused at a position within the wafer that is closer to the face side of the wafer than the reverse side of the wafer, the laser beam configured to modify an inside portion of the wafer within said outer edge of each of the surface acoustic wave devices, such that the laser beam applying does not cut the wafer, instead forming a modified layer for diffusing an acoustic wave within each of the surface acoustic wave devices, wherein the modified layer is at the position within the wafer; and
   a dividing step, performed after the grinding step and the laser beam applying step, of dividing the wafer along the projected dicing lines into a plurality of the surface acoustic wave device chips, each of said surface acoustic wave device chips including one of said plurality of surface acoustic wave devices.

2. The method according to claim 1, further comprising:
a polishing step performed after the grinding step and before the dividing step, of polishing the reverse side of the wafer.

3. The method according to claim 1, wherein each surface acoustic wave device includes a pair of interlocking electrodes.

4. The method according to claim 1, wherein each surface acoustic wave device includes a pair of interlocking comb-shaped arrays of electrodes.

5. The method according to claim 1, further comprising applying a protective member to the face side of the wafer.

6. The method according to claim 1, wherein said plurality of electrodes includes a pair of interlocking comb-shaped arrays of electrodes.

7. A method of manufacturing surface acoustic wave device chips, comprising:
a grinding step of grinding a reverse side of a wafer with a surface acoustic wave device formed in each area demarcated by a plurality of crossing projected dicing lines on a face side of the wafer;
before or after the grinding step, a laser beam applying step of applying a laser beam having a wavelength with which the wafer is transmittable to the reverse side of the wafer such that the laser beam is focused at a position within the wafer, the position being closer to the face side of the wafer than a position corresponding to a reverse side of each of the surface acoustic wave device chips to be produced from the wafer, whereby the laser beam does not cut the wafer, but instead modifies an inside portion of the wafer within the area in which the surface acoustic wave device is formed, thereby forming a modified layer for diffusing an acoustic wave; and
after the grinding step and the laser beam applying step, a dividing step of dividing the wafer along the projected dicing lines into a plurality of the surface acoustic wave device chips to manufacture a plurality of the surface acoustic wave device chips each having the modified layer formed therein for diffusing an acoustic wave.

* * * * *